United States Patent [19]

Kadokura et al.

[11] Patent Number: 4,709,221

[45] Date of Patent: Nov. 24, 1987

[54] SHEET COIL

[75] Inventors: Susumu Kadokura, Sagamihara; Ippei Sawayama, Machida; Tomoaki Kato, Sagamihara; Tadashi Okamoto, Yokohama, all of Japan

[73] Assignee: Canon Kabushiki Kaisha, Tokyo, Japan

[21] Appl. No.: 745,625

[22] Filed: Jun. 17, 1985

[30] Foreign Application Priority Data

Jun. 20, 1984 [JP] Japan .................................. 59-126974

[51] Int. Cl.$^4$ ......................... H01F 5/00; H01F 27/28
[52] U.S. Cl. .................................. 336/200; 29/602 R; 156/659.1; 336/223; 336/232; 430/314
[58] Field of Search ............... 336/222, 223, 225, 230, 336/232; 156/901, 902, 656, 659.1; 430/314, 323, 324, 318, 315, 319, 320; 204/15,16; 29/602 R

[56] References Cited

U.S. PATENT DOCUMENTS

| | | | |
|---|---|---|---|
| 4,081,823 | 3/1978 | Cook, Jr. | 204/15 X |
| 4,340,833 | 7/1982 | Sudo et al. | 310/207 X |
| 4,470,872 | 9/1984 | Sudo et al. | 156/901 X |
| 4,483,749 | 11/1984 | Shimamura | 204/15 |

FOREIGN PATENT DOCUMENTS 19759  2/1977  Japan .................................. 336/200

Primary Examiner—Thomas J. Kozma
Attorney, Agent, or Firm—Fitzpatrick, Cella, Harper & Scinto

[57] ABSTRACT

A sheet coil in the form of a conductor on an insulating substrate has a mending metal portion at a side portion forming the conductor gap so as to narrow the gap width. The sheet coil can be produced by forming a coil pattern on a base material made up of an insulating substrate and a metal layer laminated thereon by using a photosensitive material. The portion of the metal layer not covered with the photosensitive material is removed by etching, and, while the photosensitive material remains, a metal plating treatment is carried out so as to narrow the etched width of the metal layer.

3 Claims, 3 Drawing Figures

SHEET COIL

BACKGROUND OF THE INVENTION

1. Field of the Invention

The present invention relates to a sheet coil and a method for producing the sheet coil.

2. Description of the Prior Art

Heretofore, wire-winding methods have been used as a method for producing coils. However, the coils produced according to such methods have a low occupying rate of the conductor so that it is difficult to make coils small and thin, and further, precision of arrangement is not satisfactory. Therefore, improvement in accuracy of rotation of motors produced by using the coils is limited.

Methods for producing sheet coils using copper foil by means of photoetching are known. According to these methods, the resulting space between the conductors of a coil is two times or more the thickness of the conductor of the coil, and therefore there also exists a limitation for producing precise coils having a high occupying rate of conductor.

Other methods utilizing photoetching comprise etching, peeling the photosensitive resist and metalplating. The conductor gap is narrowed by the deposited metal and simultaneously the conductor becomes thick, and therefore, when the coil is laminated, the driving force of the sheet coil is lowered and, in addition, the resulting uneven thickness of the metal layer formed by plating increases the surface irregularity and thereby, after lamination, leakage often occurs disadvantageously between the adjacent sheets.

Further, there are known methods for producing sheet coils by a photoelectroforming method utilizing photoetching. A photosensitive resin pattern having recess portions in a form of spiral is formed on a base material composed of an insulating substrate and a metal layer overlying the insulating substrate, and then a metal plating layer is formed in the recess portions by plating. The photosensitive resin pattern is removed and then the metal layer on the insulating substrate corresponding to the portions which have been covered with the photosensitive resin pattern is removed by etching to produce sheet coils.

According to the above-mentioned methods, both the metal layer to be removed by etching and the metal plating layer are made of the same material so that the metal plating layer as well as the metal layer are removed to almost the same degree by the etching step. Therefore, it is difficult to maintain accuracy of the conductor thickness and conductor width; and therefore precise sheet coils can be produced with only a limited degree of accuracy.

SUMMARY OF THE INVENTION

An object of the present invention is to provide a sheet coil having a narrow conductor gap and a high conductor occupying rate.

Another object of the present invention is to provide a sheet coil having high accuracy in regard to its conductor width.

According to a further aspect of the present invention, there is provided a sheet coil comprising a conductor on an insulating substrate which comprises a mending metal portion at the side portion constituting a conductor gap for narrowing the gap width.

DESCRIPTION OF THE PREFERRED EMBODIMENT

Figure 1:
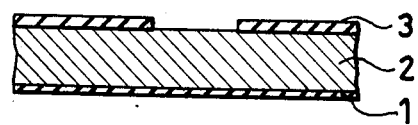
FIG. 1 is a schematic cross sectional view of a member comprising a pattern composed of a photosensitive material formed on a metal layer.
Figure 2:
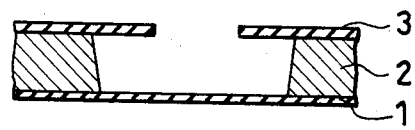
FIG. 2 is a schematic cross sectional view of the above-mentioned member where the metal layer has been side-etched by etching.
Figure 3:
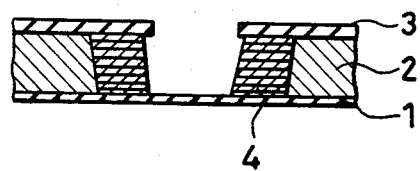
FIG. 3 is a schematic cross sectional view of the member where the side-etched portions have been mended by metal plating, according to the present invention.

Referring to FIGS. 1–3, the fundamental production steps of the method for producing a sheet coil according to the present invention will be explained.

FIG. 1 shows an arrangement in which a metal layer 2, such as copper foil, is formed on an insulating substrate 1 to fabricate a base material. Then a predetermined pattern 3, such as spiral form or the like, composed of a photosensitive material, is formed on the base material.

FIG. 2 shows a step of removing the portion of metal layer 2 which is not covered with the photosensitive material; and partucularly it shows where the metal layer has been side-etched.

FIG. 3 shows the formation of a mending metal portion 4 at the side-etched portions by metal plating to deposit metal.

As described above, the side-etched portions of the metal layer under the photosensitive material are mended by depositing metal in those portions. This results in the production of a sheet coil having a narrow conductor gap, a high conductor occupying rate and a conductor thickness which is maintained at a high accuracy.

The material for the insulating substrate constituting the sheet coil of the present invention may be, for example, a film or plate composed of a thermoplastic resin such as an acryl type resin, a polyamide type resin, a polyester type resin and the like, or a thermosetting resin such as a phenol type resin, an epoxy type resin, a polyimide type resin and the like. It is preferable to have as good an insulating property as possible. It is preferable that the thickness of the insulating substrate is as small as possible, and it is desirably about 2 to 100 $\mu$m. (microns)

The insulating substrate 1 on which the metal layer 2 is formed is provided as a base material for producing the sheet coil of the present invention. The thickness of the metal layer is determined depending on the required characteristics of the sheet coil and is practically 5 $\mu$m or more.

For example, in case that the conductor having a form of spiral is formed on the base material to produce the sheet coil, an unexposed film of a photosensitive resin is formed on the metal layer 2. The photosensitive resin film includes a liquid resist or a dry film. However, when the photosensitive film is thin, a split or crack of the film occurs in the next step, i.e., etching, and during metal plating, copper is deposited through the film. Thereby, inconveniences. i.e., shortcircuit, lowering of plane property and the like, occur when many sheet coils are laminated to form a multilayered sheet coil. Thus the thickness of the film is preferably 2 $\mu$m or more and more preferably 2.5 $\mu$m or more.

A photosensitive material constituting a dry film may include T1010(25 μm thick) produced by Du Pont and DFR 25(25 μm thick) produced by Asahi Kasei Co., Ltd. or the like and a photosensitive material consituting a liquid resist may include OMR-83 produced by Tokyo Ohka Co., and 747 produced by Kodak or the like (All are tradenames). Then the photosensitive resin film on which a mask is provided is exposed and developed with a predetermined liquid. Subsequently, the metal layer is etched. As the etching method, there may preferably be employed a spray etching method since this makes it possible to improve pattern precision.

As the etching liquid, there may be employed commercially available ferric chloride or ammonia alkali etchant, cupric chloride or the like.

Then, while the pattern composed of the above-mentioned photosensitive material remains untouched, the metal layer which has been dissolved and removed by means of the side-etching is mended by depositing metal by a plating method to the thickness needed.

The maximum thickness of the deposited metal is preferably up to the thickness of the metal dissolved by sideetching. Unless the surface of the deposited metal becomes uneven, it is possible to continue depositing the metal until a time just before the deposited metal on one side of the etching comes into contact with the deposited metal on the other side of the etching.

If the deposited metal layer should sprawl from the photosensitive material and bulges over the upper surface of the material, there might be caused some trouble such as short circuiting and the like among the sheet coil layers, when a multi-layered sheet coil is used.

As a metal plating liquid, there may be employed a liquid containing copper sulfate, copper pyrophosphate, copper cyanide or the like. The metal plating may also be performed by immersion in at plating liquid. However, it is advantageous in point of deposition rate of metal that the metal plating is performed by generating a strong stream of the plating liquid, for example, a jet stream. The stream may be generated by means of a pump, motor-stirring, air ultrasonic waves or the like. As the strength of the stream increases, the metal can be deposited at a high speed and this is also preferable from the point of view of economy.

The sheet coil of this invention maintains high precision of thickness and width of the conductor in the form of a spiral and has high reliability as compared with the prior art. Also the method for producing a sheet coil according to the invention is more simple than the prior art.

As a metal for the layer and the metal plating, there may be optionally employed a metal such as copper, aluminum, nickel, silver, gold and the like.

The present invention will be described more in detail by referring to the following Examples.

EXAMPLE 1

A copper foil of 70 μm in thickness was pressed onto a polyester film of 20 μm in thickness with adhesive while heating to prepare a base material. Then a liquid resist (mfd. by Tokyo Ohka Co., trade name, OMR-83; viscosity, 450 cp) was applied to the surface of the base material by the use of a spinner to form a photosensitive layer in the thickness of 5 μm. Thereafter, exposure was carried out masking with a spiral pattern, and spray development was effected using a liquid developer (mfd. by Tokyo Ohka Co., OMR liquid developer to form a pattern having a copper exposed portion of 50 μm in width and a 400 μm wide portion coated with the photosensitive layer. Copper was etched using a copper etching liquid (mfd. by Uemura Kogyo Co., trade name; ALFINE) by spraying. One side of the copper positioned under the photosensitive layer was dissolved due to side etching for the width of 100 μm.

Copper was replenished to one undercut side surface of the copper layer under the photosensitive layer using electroplating by the width of 90 μm at 20 A/cm$^2$ for 5 minutes employing a copper electroplating solution (mfd. by Okuno Seiyaku Kogyo Co., trade name; LUCINA 81) which was jetted forcedly by a pump. Thereby a sheet coil formed which has a copper thickness of 70 μm and a gap of 70 μm in width.

EXAMPLE 2

A copper foil of 140 μm in thickness was pressed onto a polyamide film of 10 μm in thickness with adhesive while heating to prepare a base material. Then a dryfilm (mfd. by Du Pont; trade name, T1010) was applied to the surface of the base material by the use of a laminator to form a photosensitive layer. Thereafter, exposure was carried out masking with a spiral pattern and spray development was effected using a liquid developer (trichloroethylene) to form a pattern having a copper exposed portion of 50 μm in width and a portion of 500 μm in width coated with the photosensitive layer. Then, copper was etched using a solution of cupric chloride by spraying. One side of the copper positioned under the photosensitive layer was dissolved due to side etching for the width of 150 μm.

Copper was replenished to one undercut side surface of the copper layer under the photosensitive layer using electroplating by a width of 120 μm at 10 A/cm$^2$ for 20 minutes employing a copper electroplating solution which was jetted forcibly by supersonic waves (mfd. by Uemura Kogyo Co., trade name; THRUCUP AC). Thereby the sheet coil was formed having a copper thickness of 140 μm and a gap of 110 μm in width.

What we claim is:

1. In a sheet coil comprising a conductor in the form of a coil on an insulating substrate, said coil having a side portion extending up from the substrate and defining a gap between adjacent turns of the coil, a mending metal portion deposited at the side portion for narrowing the gap width, the thickness of the deposited metal in the direction of the thickness of the coil being such that the deposited metal does not bulge up over the upper surface of the coil.

2. A sheet coil according to claim 1 in which the conductor is 5 μm or more thick.

3. A sheet coil according to claim 1, wherein the mending metal portion comprises a metal deposited by a plating treatment.

* * * * *

UNITED STATES PATENT AND TRADEMARK OFFICE
CERTIFICATE OF CORRECTION

PATENT NO. : 4,709,221
DATED : November 24, 1987
INVENTOR(S) : SUSUMU KADOKURA, ET AL.

It is certified that error appears in the above-identified patent and that said Letters Patent is hereby corrected as shown below:

COLUMN 2

Line 3, "cross sectional" should read --cross-sectional--.
    Line 6, "cross sectional" should read --cross-sectional--.
    Line 9, "cross sectional" should read --cross-sectional--.
    Line 27, "partucularly" should read --particularly--.

COLUMN 3

Line 23, "sideetching." should read --side-etching.--.
    Line 36, "at" should read --a--.

COLUMN 4

Line 5, "developer to" should read --developer) to--.
    Line 18, "forcedly" should read --forcibly--.

Signed and Sealed this

Nineteenth Day of April, 1988

Attest:

DONALD J. QUIGG

*Attesting Officer*      *Commissioner of Patents and Trademarks*